United States Patent
Ishihara et al.

(10) Patent No.: US 9,299,888 B2
(45) Date of Patent: Mar. 29, 2016

(54) CLAD MATERIAL FOR LED LIGHT-EMITTING ELEMENT HOLDING SUBSTRATE, AND METHOD FOR MANUFACTURING SAME

(75) Inventors: Yosuke Ishihara, Omuta (JP); Hideki Hirotsuru, Omuta (JP); Hideo Tsukamoto, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 14/344,196

(22) PCT Filed: Sep. 5, 2012

(86) PCT No.: PCT/JP2012/072563
§ 371 (c)(1),
(2), (4) Date: Mar. 11, 2014

(87) PCT Pub. No.: WO2013/038964
PCT Pub. Date: Mar. 21, 2013

(65) Prior Publication Data
US 2014/0339596 A1   Nov. 20, 2014

(30) Foreign Application Priority Data
Sep. 13, 2011   (JP) ................. 2011-199953

(51) Int. Cl.
*H01L 33/12* (2010.01)
*H01L 33/00* (2010.01)
*H01L 33/30* (2010.01)
*H01L 33/48* (2010.01)
*H01L 33/64* (2010.01)

(52) U.S. Cl.
CPC ............. *H01L 33/12* (2013.01); *H01L 33/005* (2013.01); *H01L 33/30* (2013.01); *H01L 33/48* (2013.01); *H01L 33/641* (2013.01); *H01L 33/0079* (2013.01); *H01L 2933/0025* (2013.01)

(58) Field of Classification Search
None
See application file for complete search history.

(56) References Cited

U.S. PATENT DOCUMENTS

| 5,218,216 A   | 6/1993 | Manabe et al. |
| 6,369,332 B1* | 4/2002 | Saitoh et al. .............. 174/260 |

(Continued)

FOREIGN PATENT DOCUMENTS

| EP | 1 944 116 A1 | 7/2008 |
| EP | 2 400 571 A1 | 12/2011 |

(Continued)

OTHER PUBLICATIONS

Oct. 2, 2012 Search Report issued in International Patent Application No. PCT/JP2012/072563 (with translation).

(Continued)

*Primary Examiner* — Khaja Ahmad
(74) *Attorney, Agent, or Firm* — Oliff PLC (57) ABSTRACT

Disclosed is a clad material for an LED light-emitting element holding substrate in which a plurality of layers composed of different materials are stacked and bonded via a metal layer to a III-V group semiconductor crystal surface, the linear expansion coefficient being $14 \times 10^{-6}$/K or less and the thermal conductivity at a temperature of 25° C. being 200 W/mK or greater. The clad material is composed of three alternately stacked layers: two copper layers and a molybdenum layer, the molybdenum layer being 10 to 60 vol % and the difference in thickness between the copper layers being 5% or less; or a clad material composed of three copper layers alternately stacked with molybdenum layers to make five layers, the molybdenum layers being 20 to 70 vol % and the difference in thickness between the top and bottom two copper layers and the molybdenum layers being 5% or less.

13 Claims, 2 Drawing Sheets

(56) References Cited

U.S. PATENT DOCUMENTS

| | | | |
|---|---|---|---|
| 2006/0091409 A1 | 5/2006 | Epler et al. | |
| 2008/0118199 A1* | 5/2008 | Asai | G02B 6/4204 385/14 |
| 2009/0258248 A1* | 10/2009 | Tsushima | 428/656 |
| 2011/0298002 A1* | 12/2011 | Takeuchi et al. | 257/99 |

FOREIGN PATENT DOCUMENTS

| | | |
|---|---|---|
| JP | A 2-102551 | 4/1990 |
| JP | B2 5-73252 | 10/1993 |
| JP | A 6-268117 | 9/1994 |
| JP | A 2004-249589 | 9/2004 |
| JP | A 2005-117006 | 4/2005 |
| JP | A 2006-128710 | 5/2006 |
| JP | B1 3862737 | 10/2006 |
| JP | A 2010-192701 | 9/2010 |
| JP | A 2011-103353 | 5/2011 |

OTHER PUBLICATIONS

Jun. 10, 2015 extended European Search Report issued in European Application No. 12832675.8.

* cited by examiner

CLAD MATERIAL FOR LED LIGHT-EMITTING ELEMENT HOLDING SUBSTRATE, AND METHOD FOR MANUFACTURING SAME

TECHNICAL FIELD

The present invention relates to a clad material used for a light-emitting diode (hereinafter referred to as an LED) element comprising a group III-V semiconductor crystal and a method for manufacturing the same, as well as an LED light-emitting element manufactured using said clad material.

BACKGROUND ART

LEDs are elements that emit light when an electrical current flows in a forward direction across a p-n junction of a semiconductor, manufactured using group III-V semiconductor crystals such as GaAs and GaN. In recent years, advances in semiconductor epitaxial growth techniques and light-emitting element processing techniques have led to development of LEDs with excellent conversion efficiency, and their broad usage in various fields.

LEDs are composed of a photoactive layer sandwiched between a p-type layer and n-type layer formed by epitaxial growth of group III-V semiconductor crystals on a single-crystal growth substrate. In general, LED light-emitting elements are formed by epitaxially growing crystals of a group III-V semiconductor such as GaN on a growth substrate of single-crystal sapphire or the like, then forming electrodes etc. (Patent Document 1).

When epitaxially growing group III-V semiconductor crystals on a single-crystal growth substrate, it is difficult to grow good single crystals due to the difference in lattice constant between the single-crystal growth substrate and the group III-V semiconductor crystals. For this reason, a method of forming a buffer layer of AN or the like at a low temperature on the sapphire substrate, then epitaxially growing GaN thereon has been proposed (Patent Document 2). However, even when using such a technique, differences in the coefficient of linear thermal expansion between the sapphire substrate and the GaN can lead to warping of the substrate after epitaxial growth, and in the worst case, the substrate may crack. For this reason, a substrate material with a coefficient of linear thermal expansion close to that of group III-V semiconductor crystals is sought.

On the other hand, single-crystal growth substrates such as single-crystal sapphire substrates have the problem of poor thermal conductivity. In the case of single-crystal sapphire, the thermal conductivity is about 40 W/mK, which is insufficient to adequately dissipate the heat generated by a group III-V semiconductor such as GaN. In high-power LEDs using large currents, the device temperature can rise and reduce light-emitting efficiency and device life. For this reason, a method has been proposed of epitaxially growing a group III-V semiconductor crystal on a single-crystal growth substrate, then bonding a high thermal conductivity substrate via a metal layer, and subsequently removing the single-crystal growth substrate (Patent Document 3). As high thermal conductivity substrates for this purpose, materials excelling in thermal conductivity such as copper have been considered, but they are not satisfactory for use with high-power LEDs as they differ significantly from group III-V semiconductor crystals in coefficient of thermal expansion.

Patent Document 1: JP 2005-117006 A
Patent Document 2: JP H5-73252 B
Patent Document 3: JP 2006-128710 A

SUMMARY OF THE INVENTION

The present invention has been made in consideration of the above-described circumstances, and has the purpose of offering a clad material for use in substrates for holding LED light-emitting elements, with a small difference in coefficient of linear thermal expansion from the group III-V semiconductor crystals forming LEDs, with excellent thermal conductivity and appropriate for use with high-power LEDs.

Additionally, the present invention has the purpose of offering a method of manufacturing the aforementioned clad material and an LED light-emitting element produced using the aforementioned clad material.

In other words, a principal embodiment of the present invention offers a clad material for use with a substrate for holding an LED light-emitting element, formed by lamination of a plurality of layers consisting of different materials, and bonded to a group III-V semiconductor crystal surface via a metal layer, having a coefficient of linear expansion of $14 \times 10^{-6}$/K or less, and a thermal conductivity of 200 W/mK or more at a temperature of 25° C.

The clad material is preferably formed by alternately laminating copper layers and molybdenum layers. In one embodiment, the clad material consists of three layers formed by alternately laminating two copper layers and a molybdenum layer, wherein a proportion occupied by the molybdenum layer is 10 to 60 vol %, and a thickness difference between the two copper layers is 5% or less. In another embodiment, the clad material consists of three layers formed by alternately laminating three copper layers and molybdenum layers, wherein a proportion occupied by the molybdenum layer is 20 to 70 vol %, and a thickness difference between the two copper layers on the top and bottom surface and the molybdenum layers is 5% or less.

Additionally, a preferred embodiment of the clad material for use with a substrate for holding an LED light-emitting element of the present invention has a plate thickness of 0.05 mm to 0.2 mm, and a surface roughness (Ra) of 0.01 to 0.5 µm. Additionally, it may have an Ni plating layer or an Ni plating layer+Au plating layer of thickness 0.5 to 5 µm formed on the surface.

Another embodiment of the present invention offers a method of manufacturing a clad material comprising a step of laminating a plurality of layers consisting of different materials, then bonding the laminate by hot uniaxial processing with an applied pressure of at least 4.9 MPa and at most 14.7 MPa, at a temperature of at least 850° C. and at most 1000° C. The bonding by hot uniaxial processing is preferably performed in a nitrogen atmosphere, an argon atmosphere, a helium atmosphere or in a vacuum.

Furthermore, the present invention offers an LED light-emitting element manufactured by a method comprising:
(1) a step of epitaxially growing a group III-V semiconductor crystal on one principal face of a single-crystal growth substrate;
(2) a step of bonding a clad material in accordance with any one of claims 1 to 6 to the group III-V semiconductor crystal surface via a metal layer and removing the single-crystal growth substrate from the back surface; and
(3) a step of performing a surface treatment on the group III-V semiconductor crystal surface, forming electrodes, then cutting. In one embodiment, the single-crystal growth substrate is chosen from the group consisting of single-crystal sapphire, single-crystal silicon carbide, single-crystal GaAs and single-crystal Si, and in particular, is coated with a material chosen from the group consisting of AlN, SiC, GaN and GaAs. Additionally, in one embodiment, the group III-V semiconductor crystal is one of GaN, GaAs and GaP.

The present invention uses a clad material formed by lamination of a plurality of layers consisting of different materials, and bonded to a group III-V semiconductor crystal surface via a metal layer, having a coefficient of linear expansion of $14 \times 10^{-6}$/K or less, and a thermal conductivity of 200 W/mK or more at a temperature of 25° C. Furthermore, the clad material for use with a substrate for holding an LED light-emitting element of the present invention can be made conductive in a preferred embodiment, so electrodes can be formed on both surfaces of the group III-V semiconductor crystal forming the LED. For this reason, the manufacturing process for the LED light-emitting elements can be reduced, while also increasing the amount of light emitted per unit area.

MODES FOR CARRYING OUT THE INVENTION

The clad material for use in a substrate for holding an LED light-emitting element according to an embodiment of the present invention, a method of manufacture thereof, and an LED light-emitting element formed using the clad material shall be explained below.

The single-crystal growth substrate used in an embodiment of the present invention must be a material with few defects having a lattice constant that has a small difference from the group semiconductor crystal to be epitaxially grown in later steps, so it is common to use a processed single-crystal material for its crystallinity and uniformity. These single-crystal growth substrates must be capable of withstanding the temperatures and atmospheres used during the epitaxial growth of the group semiconductor crystals. For this reason, the material for the single-crystal growth substrate used in an embodiment of the present invention is preferably chosen from the group consisting of single-crystal sapphire, single-crystal silicon carbide, single-crystal GaAs and single-crystal Si. Furthermore, the single-crystal growth substrate used in the present invention is preferably surface-coated with a material chosen from the group consisting of AlN, SiC, GaN and GaAs.

The group III-V semiconductor crystal constituting the LED is preferably one of GaN, GaAs and GaP in view of their conversion efficiency as LED light-emitting elements. These group III-V semiconductor crystals provide a high light-emitting efficiency and different types can be used depending on the application. The group III-V semiconductor crystals may be selected according to the optimal emission wavelength for each application.

In an embodiment of the present embodiment, a group III-V semiconductor crystal is grown on a principal surface of a flat single-crystal growth substrate such as a disc or a rectangular plate by epitaxial growth. The epitaxial growth of the group III-V semiconductor crystal should preferably be performed by metal organic chemical vapor deposition (MOCVD) or halide vapor epitaxial growth (HVPE). MOCVD is suitable for growing a group III-V semiconductor crystal with good crystallinity, and HVPE has a fast crystal growth rate and is capable of efficiently growing a group III-V semiconductor crystal. These methods are publicly known, and their conditions can be set as needed. The method of epitaxial growth need not be limited to the aforementioned methods as long as the method is capable of growing a group III-V semiconductor crystal.

The epitaxially grown group III-V semiconductor crystal may be surface-treated in order to further improve the light-emitting properties. Additionally, the surface may be etched or polished in order to improve the uniformity of the crystal surface.

In one embodiment of the present invention, the clad material is bonded to the epitaxially grown group III-V semiconductor crystal, but in order to do so, the metal layer is formed on the surface of the group III-V semiconductor crystal by a technique such as vapor deposition or sputtering. The metal layer should preferably be formed from indium, aluminum, gold, silver or an alloy thereof. Regarding the thickness of the metal layer, since the coefficient of linear thermal expansion of metals differs from that of group III-V semiconductor crystals, it should preferably not be extremely thick as this reduces the closeness of contact. If the thermal conductivity of the metal layer is low, this is also unfavorable in terms of heat dissipation. For this reason, the thickness of the metal layer should preferably be 0.5 to 10 μm, more preferably 0.5 to 2 μm.

The clad material according to an embodiment of the present invention is formed by laminating a plurality of layers consisting of different materials, preferably by alternately laminating copper layers and molybdenum layers. A metal layer is similarly formed on the surface of the clad material by vapor deposition, sputtering or the like for bonding of the group III-V semiconductor crystal. The metal layer is preferably formed from indium, aluminum, gold, silver or an alloy thereof. The properties desired in the clad material are (1) having sufficient strength to withstand bonding, and (2) lacking voids or intervening substances such as contaminants on the bonding surface, so that the bonding surface is flat. In order to satisfy condition (1), the three-point bending strength of the clad material must be at least 50 MPa. In order to satisfy condition (2), the surface roughness (Ra) of the clad material must be 0.5 μm or less, preferably 0.01 to 0.5 μm, and more preferably 0.01 to 0.2 μm.

The bonding of the group III-V semiconductor crystal and the clad material is performed by heating with the bonding surfaces held together, while applying pressure as needed. While the heating temperature will differ depending on the type of metal layer, it should generally be 250° C. to 550° C. The pressure to be applied should generally be 2 to 20 MPa.

Since the clad material is used for bonding with the group III-V semiconductor crystal, it is important for the difference in coefficient of linear thermal expansion between the materials to be small. For this reason, the coefficient of linear thermal expansion of the clad material must be $14\times10^{-6}$/K or less, preferably 5 to $8\times10^{-6}$/K. When the coefficient of linear thermal expansion of the clad material is $14\times10^{-6}$/K or more, the difference in the coefficient of linear thermal expansion with the group III-V semiconductor crystal to be bonded may cause warping after bonding, peeling of the bonding layer when used as an LED light-emitting element, or cracking of the group III-V semiconductor crystal, which is undesirable. Additionally, regarding the lower limit of the coefficient of linear thermal expansion of the clad material, when the clad material is formed, for example, from layers of copper and molybdenum, the coefficient of linear thermal expansion of the molybdenum is $5\times10^{-6}$/K, so it cannot be lower.

Even if the total film thickness of layers consisting of a first material is the same as the total film thickness of layers consisting of a second material, the coefficient of linear thermal expansion of the clad material of the present invention will change depending on the total number and thickness of each layer. This is because when the layers undergo thermal expansion, they are affected by the other layers lying adjacent above and below. That is, when a layer consisting of a first material having a higher coefficient of linear expansion thermally expands, it is affected by layers consisting of a second material having a lower thermal expansion lying adjacent above and below, so stress is generated in the direction of suppression of the thermal expansion. As a result, the coefficient of linear expansion for the entire clad material can be reduced.

The clad material of the present invention forms a base substrate for an LED light-emitting element. Most of the heat generated by the group III-V semiconductor device will be dissipated through this substrate, requiring the substrate to have good heat dissipating properties. For this reason, the thermal conductivity of the clad material at a temperature of 25° C. is at least 200 W/mK. If the thermal conductivity is less than 200 W/mK, then the heat generated by the group III-V semiconductor element cannot be sufficiently dissipated, and in high-power LEDs requiring large currents in particular, the temperature of the element can rise, resulting in reduced light-emitting efficiency and shorter device life. On the other hand, as for the upper limit of the thermal conductivity, when the clad material is formed from layers of copper and molybdenum, for example, the thermal conductivity of copper is 390 W/mK, and this cannot be exceeded.

The thermal conductivity of the clad material of the present invention is determined by the total film thickness of layers consisting of the first material and the total film thickness of layers consisting of the second material. In other words, as long as the total film thicknesses are the same, then the thermal conductivity will be the same regardless of the total number or arrangement. This is because the thermal conductivity of each layer is independent and unaffected by the thermal conductivity in other layers.

For the purpose of heat dissipation, the thickness of the clad material should preferably be thin. On the other hand, some thickness is necessary because it needs enough strength to hold the group III-V semiconductor element and withstand handling when making the LED light-emitting element. Therefore, the thickness of the clad material should preferably be 0.05 mm to 0.2 mm. If the thickness of the clad material exceeds 0.2 mm, the heat dissipating properties of the LED light-emitting element will decrease. Furthermore, the clad material of the present invention may be thinned by polishing or the like after bonding with the group III-V semiconductor crystal, but this is not preferred because the properties will change.

In the present invention, the single-crystal growth substrate is removed after the group III-V semiconductor crystal and the clad material has been bonded via a metal layer. The removal of the single-crystal growth substrate is generally performed by a method of removal by laser irradiation from the substrate side. Aside therefrom, the single-crystal growth substrate can be removed by polishing or etching. The surface of the group III-V semiconductor crystal after removal of the single-crystal growth substrate may be finished to a desired surface condition by polishing or etching the surface as needed, then electrodes may be formed by techniques such as vapor deposition and sputtering. These can then be cut to predetermined shapes by laser cutting or dicing to produce LED light-emitting elements.

The clad material according to a preferred embodiment of the present invention is formed by alternately laminating copper layers and molybdenum layers, and the clad material itself has electrical conductivity. For this reason, electrodes can be formed on both surfaces of the group III-V semiconductor crystal constituting the LED. When using an insulator material such as a sapphire crystal as the substrate, a portion of the upper p-type or n-type group III-V semiconductor crystal must be removed by etching or the like to form electrodes on the same side. The volume resistivity of the clad material according to an embodiment of the present invention should preferably be $10^{-9}$ to $10^{-5}$ $\Omega\cdot$m. If the volume resistivity exceeds $10^{-5}$ $\Omega\cdot$m, the light-emitting efficiency will be undesirably low. As for the lower limit of the volume resistivity, there are no restrictions in terms of the properties, but it should generally be at least $10^{-9}$ $\Omega\cdot$m based on the material composition.

Herebelow, the method of producing the clad material shall be explained. The clad material is produced by bonding a layer consisting of a first material or a layer consisting of a second material by hot uniaxial processing with an applied pressure of at least 4.9 MPa and at most 14.7 MPa, at a temperature of at least 850° C. and at most 1000° C.

According to this manufacturing method, the layer consisting of a first material or layer consisting of a second material of a predetermined film thickness is formed by a so-called hot press process of lamination by applying pressure in one direction (thickness direction) at a high temperature. At this time, particularly if copper is being used as the first material, the atmosphere should preferably lack oxygen because copper is a material that is highly susceptible to oxidation. For this reason, the above step should be performed in a nitrogen atmosphere, an argon atmosphere, a helium atmosphere or a vacuum.

While a plating layer may be formed on the surface of each layer in order to make lamination easier, a plating layer should preferably not be formed since it can cause reduced thermal conductivity. However, when using this clad material as a heat dissipating substrate, if another substance is to be brazed or soldered to the uppermost layer and lowermost layer, plating layers should preferably be pre-formed on the uppermost layer and lowermost layer since this makes bonding easier.

The temperature during bonding by hot uniaxial processing should be at least 850° C. and at most 1000° C. If lower than 850° C., the bonding can be defective and peeling may occur. If higher than 1000° C., when copper is used as the first material, the copper may melt.

The pressure applied at the time of bonding by hot uniaxial processing is at least 4.9 MPa and at most 19.7 MPa. If less than 4.9 MPa, the bonding may be defective and peeling may occur. If more than 19.7 MPa, particularly when using copper as the first material, the softened copper will be greatly extended when pressed, making it difficult to achieve the designated thickness arrangement. Additionally, a mold release agent such as BN powder must be applied to the press jig in order to enable the clad material to be released after bonding.

Additionally, since the uppermost layer and lowermost layer only have an adjacent layer on one side, the second material should preferably be used for these layers in order to make the coefficient of linear expansion small, but these layers will be directly brazed or plated, so it is more preferable to use copper which would be a first material as a material that would enable these to be performed more easily.

The layer consisting of the second material has a lower thermal conductivity than the layer consisting of the first material, so as the total thickness of the layers consisting of the second material increases, the thermal conductivity of the clad material decreases. For this reason, the total thickness of the layers consisting of the second material should preferably be small as long as the coefficient of linear expansion is not too large.

In a preferred embodiment, the clad material of the present invention consists of three layers formed by alternately laminating two copper layers and a molybdenum layer, wherein the proportion occupied by the molybdenum layer is preferably 10 to 60 vol %. If the proportion occupied by the molybdenum layer is less than 10 vol %, the coefficient of linear thermal expansion will be too large, and if it is more than 60 vol %, the thermal conductivity will be too low. Furthermore, the thickness difference between the two copper layers should preferably be 5% or less. If the thickness difference between the two copper layers exceeds 5%, warping may undesirably occur.

Additionally, in another preferred embodiment, the clad material of the present invention consists of five layers formed by alternately laminating three copper layers and two molybdenum layers, of which the proportion occupied by the molybdenum layer should preferably be 20 to 70 vol %. If the proportion occupied by the molybdenum layer is less than 20 vol %, then the coefficient of linear thermal expansion will be too high, and if it is more than 70 vol %, then the thermal conductivity will be too low. Furthermore, the thickness difference between the upper and lower copper layers and the thickness difference between the molybdenum layers should preferably be 5% or less. If the thickness difference between the upper and lower copper layers and the thickness difference between the molybdenum layers exceeds 5%, warping may undesirably occur.

Additionally, the resulting clad material will have residual mold release agent on the surface layer, requiring removal with sandpaper or by slight etching using $HNO_3$.

Since the properties of the clad material of the present invention will change depending on the thicknesses of the layers consisting of the first material and the layers consisting of the second material, they cannot be surface-treated after hot pressing. Therefore, the thicknesses of the layers must be chosen so that the total thickness of the layers will come to 0.05 to 0.2 mm.

Next, an example of a method of processing the resulting clad material will be explained. The resulting clad material can be easily machined, for example, by press punching. It can also be processed by a waterjet cutter, an electrical discharge cutter, a laser cutter or a dicing machine. After externally machining to a predetermined size, the pieces are cleaned.

Furthermore, a Ni plating layer or a Ni plating layer+Au plating layer of thickness 0.5 to 5 µm is formed on the surface. The plating method may be electroless plating or electroplating. If the plating later thickness is less than 0.5 µm, pin holes may form, reducing the chemical resistance. On the other hand, if the plating thickness exceeds 5.0 µm, the thermal conductivity properties may decrease or the electrical resistance may increase.

EXAMPLES

Example 1

<Production of Clad Material for Substrate for Holding LED Light-Emitting Element>

Figure 1:
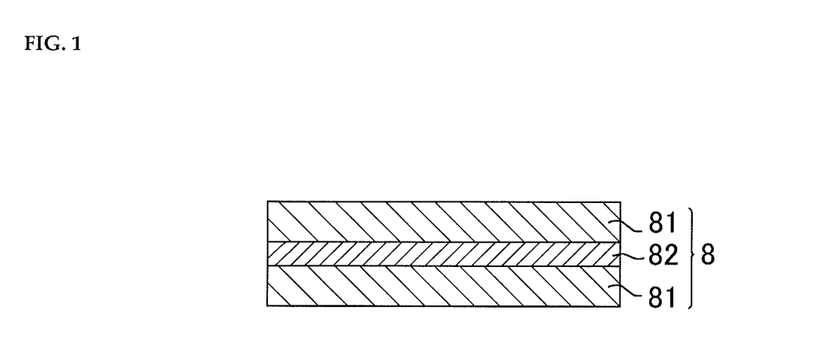
[FIG. 1] A schematic side section view of a clad material for use in a substrate for holding an LED light-emitting element according to an embodiment of the present invention.

Copper plates (purity 99.9%) of diameter 200 mm and thickness 90 µm (reference number 81 in FIG. 1) and a molybdenum plate (purity 99.9%) of diameter 200 mm and thickness 20 µm (reference number 82 in FIG. 1) were prepared. The two copper plates and the molybdenum plate were alternately laminated, then sandwiched between graphite plates of diameter 200 mm coated with a BN mold release agent.

The resulting laminate was set in a hot press machine, and hot-pressed for one hour in a vacuum at a temperature of 950° C. with an applied pressure of 9.8 MPa. After cooling to room temperature and withdrawing, the BN mold release agent was removed with sandpaper to obtain a clad material (reference number 8 in FIG. 1) of diameter 200 mm×0.2 mm with a surface roughness (Ra) of 0.1 µm.

The resulting clad material was used to prepare a test sample for measuring the coefficient of linear thermal expansion (3 mm×10 mm), a test sample for measuring the thermal conductivity (25 mm×25 mm) and a test sample for measuring the volume resistivity (50 mm×50 mm). The respective test samples were used to measure the coefficient of linear thermal expansion from temperatures of 25° C. to 150° C. (Seico Electronics TMA 300), the thermal conductivity at a temperature of 25° C. by the laser flash method (Ulvac TC3000) and the volume resistivity using the four-terminal method (according to JIS R1637). As a result, the coefficient of linear thermal expansion from temperatures of 25° C. to 150° C. was found to be $12.7 \times 10^{-6}$/K, thermal conductivity at a temperature of 25° C. was found to be 265 W/mK, and the volume resistivity was found to be $5 \times 10^{-8}$ Ω·m.

The above-described clad material was processed to an external diameter of ϕ 50.8 mm using a press punching method, ultrasonically cleaned in pure water followed by isopropyl alcohol, then dried. This processed clad material was subjected to Ni—P electroless plating and Au electroplating to form a 1.3 µm (Ni—P: 1 µm+Au: 0.3 µm) plating layer on the surface, resulting in a plated clad material.

<Production of LED Light-Emitting Element>

Figure 2:
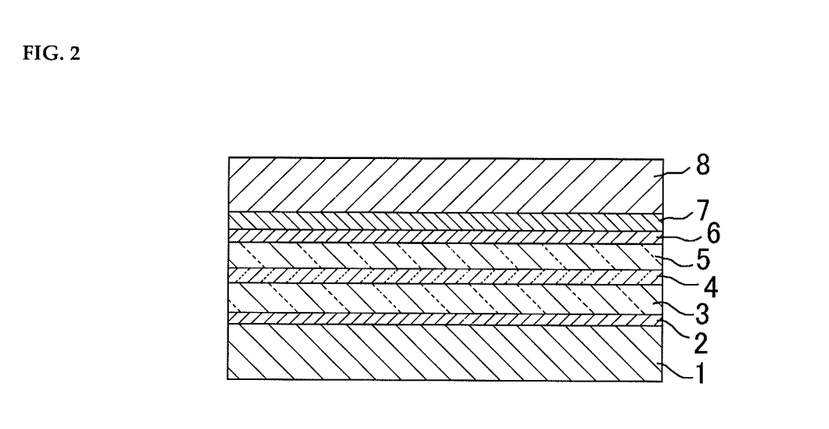
[FIG. 2] A schematic side section view of an LED light-emitting element according to an embodiment of the present invention being formed using the clad material of FIG. 1, showing the state before removal of the single-crystal growth substrate.

MOCVD was performed on a single-crystal sapphire substrate (reference number 1 in FIG. 2) of thickness 0.5 mm at a temperature of 1100° C. using ammonia gas and trimethylgallium, and a mixture of hydrogen and nitrogen as the carrier gas, to grow GaN single crystals (1) to (4) as indicated below to a thickness of 4 µm. The structure is shown in FIG. 2.

(1) n-type GaN buffer layer 2
(2) n-type GaN semiconductor layer 3
(3) GaN active layer (light-emitting layer) 4
(4) p-type GaN semiconductor layer 5

Next, a silver/tin alloy (metal layer 6 in FIG. 2) was deposited to a thickness of 2 µm on the surface of the p-type GaN semiconductor layer by vacuum deposition. On the other hand, a silver/tin alloy (metal layer 7 in FIG. 2) was deposited to a thickness of 2 μm on the surface on one side of the clad material 8 for use in a substrate for holding a LED light-emitting element. Both substrates were laminated so that the silver/tin alloy layers come into contact as shown in FIG. 2, and bonded by holding for 5 minutes at a temperature of 400° C. while applying 5 MPa of pressure. The resulting bonded body was irradiated by a nitrogen gas laser from the sapphire substrate side so as to have a power of 40 MW/cm², to thereby strip the sapphire substrate 1. The laser irradiation caused the n-type GaN buffer layer to decompose into Ga and nitrogen, and the sapphire substrate 1 was able to be stripped by the generated nitrogen gas.

Figure 3:
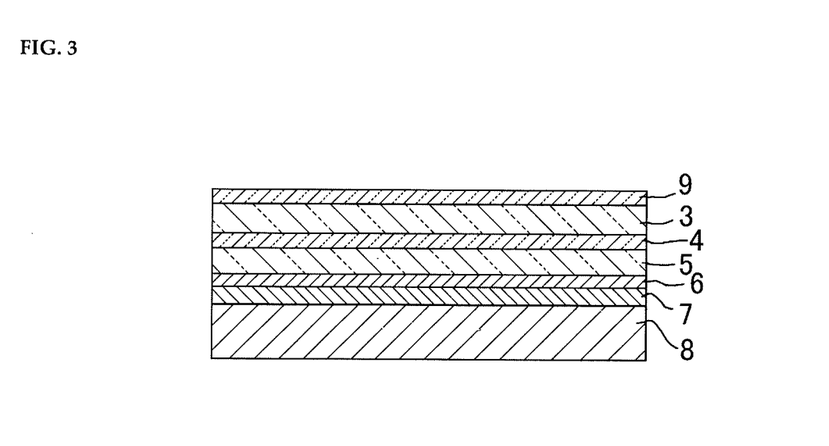
[FIG. 3] A schematic side section view of an LED light-emitting element after removal of the single-crystal growth substrate from the state shown in FIG. 2.

Subsequently, the n-type GaN buffer layer (reference number 2 in FIG. 2) exposed to the surface was removed by etching, then a transparent conductive layer (reference number 9 in FIG. 3) of indium tin oxide was formed as shown in FIG. 3. Then, Au was deposited to form n-type electrodes, and dicing was performed to yield separate LED light-emitting elements. The resulting LED light-emitting elements were observed to dissipate heat from the holding substrate, consequently having a suppressed decrease in light-emitting efficiency caused by increased element temperatures.

Examples 2-6

<Production of Clad Material for Substrate for Holding LED Light-Emitting Element>

Copper plates (purity 99.9%) of diameter 200 mm and the thicknesses shown in Table 1 (reference number 81 in FIG. 1) and molybdenum plates (purity 99.9%) of diameter 200 mm and the thicknesses shown in Table 1 (reference number 82 in FIG. 1) were prepared. Two copper plates and a molybdenum plate were alternately laminated, then sandwiched between graphite plates of diameter 200 mm coated with a BN mold release agent.

The resulting laminate was set in a hot press machine, and hot-pressed for one hour in a vacuum at a temperature of 900° C. with an applied pressure of 11.8 MPa. After cooling to room temperature and withdrawing, the BN mold release agent was removed with sandpaper to obtain a clad material (reference number 8 in FIG. 1) of diameter 200 mm and the thicknesses and surface roughnesses (Ra) shown in Table 1.

The resulting clad material was used to prepare a test sample for measuring the coefficient of linear thermal expansion (3 mm×10 mm), a test sample for measuring the thermal conductivity (25 mm×25 mm) and a test sample for measuring the volume resistivity (50 mm×50 mm). The respective test samples were used to measure the coefficient of linear thermal expansion from temperatures of 25° C. to 150° C. (Seico Electronics TMA 300), the thermal conductivity at a temperature of 25° C. by the laser flash method (Ulvac TC3000) and the volume resistivity using the four-terminal method (according to JIS R1637). The resulting coefficients of linear thermal expansion from temperatures of 25° C. to 150° C., thermal conductivities at a temperature of 25° C., and volume resistivities are shown in Table 1.

TABLE 1

| | Metal Plate Thick (μm) | | Clad Thick. | Surf. Rough. | Therm. Cond. | Coeff. Lin. Therm. Expan. | Vol. Resist. |
|---|---|---|---|---|---|---|---|
| | Cu | Mo | (mm) | (Ra) (μm) | (W/mK) | (×10⁻⁶/K) | (Ω·m) |
| Example 2 | 40 | 20 | 0.1 | 0.1 | 340 | 11.7 | $5 \times 10^{-8}$ |
| Example 3 | 35 | 30 | 0.1 | 0.11 | 316 | 10.8 | $5 \times 10^{-8}$ |
| Example 4 | 25 | 50 | 0.1 | 0.08 | 266 | 8.8 | $6 \times 10^{-8}$ |
| Example 5 | 20 | 60 | 0.1 | 0.08 | 245 | 7.9 | $6 \times 10^{-8}$ |
| Example 6 | 15 | 20 | 0.05 | 0.09 | 291 | 9.8 | $6 \times 10^{-8}$ |
| Example 7 | 20 | 20 | 0.1 | 0.09 | 295 | 8.7 | $6 \times 10^{-8}$ |

<Production of LED Light-Emitting Element>

Next, an example of the production of an LED light-emitting element using a clad material for use in a substrate for holding an LED light-emitting element according to Examples 2-6 will be described.

A growth substrate (reference number 1 in FIG. 4) was produced by forming 2 μm of a SiC layer (reference number 10 in FIG. 4) by CVD on a single-crystal Si substrate (reference number 11 of FIG. 4) with a plate thickness of 0.5 mm, after which HVPE was performed at a temperature of 1050° C. using ammonia gas and gallium chloride, with hydrogen gas as the carrier gas, to grow the GaN single crystals of (1) to (3) to a thickness of 4 μm.

(1) n-type GaN semiconductor layer 3
(2) GaN active layer (light-emitting layer) 4
(3) p-type GaN semiconductor layer 5

Figure 4:
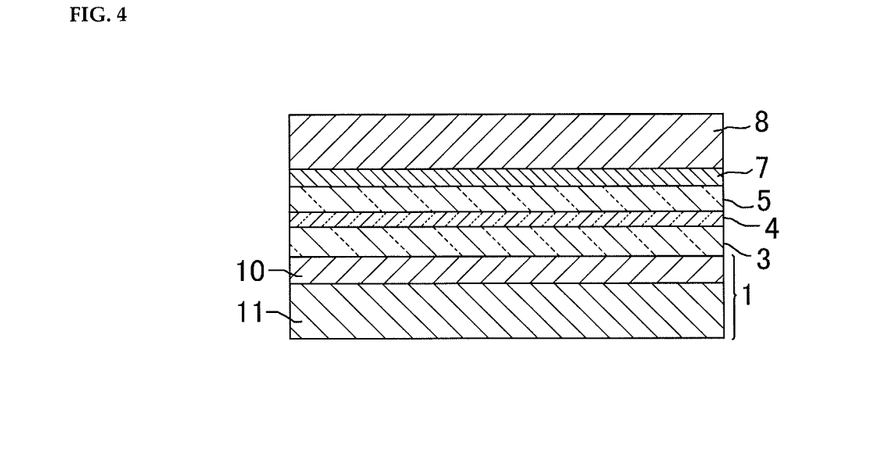
[FIG. 4] A schematic side section view of an LED light-emitting element according to another embodiment of the present invention.

Next, vacuum deposition was performed on the surface of the p-type GaN semiconductor layer to deposit silver to a thickness of 0.5 μm and an Au/tin alloy to a thickness of 1.5 μm. On the other hand, an Au/tin alloy (metal layer 7 in FIG. 2) was deposited to a thickness of 1.5 μm on the surface on one side of the clad material for use in a substrate for holding a LED light-emitting element according to examples 13 to 19. The substrates were laminated so that the Au/tin alloy layers came into contact as shown in FIG. 4, and bonded by holding for 5 minutes at a temperature of 500° C. while applying 5 MPa of pressure. The resulting bonded body was etched by an acid treatment to remove the single-crystal Si layer, after which the SiC layer was completely removed by grinding.

Subsequently, the exposed n-type GaN layer surface was etched to roughen the surface, after which a transparent conductor layer of indium tin oxide was formed. Next, Au was deposited to form n-type electrodes, and separate LED light-emitting elements were formed by laser cutting. The resulting LED light-emitting elements were observed to dissipate heat from the holding substrate, consequently having a suppressed decrease in light-emitting efficiency caused by increased element temperatures.

Example 7

<Production of Clad Material for Substrate for Holding LED Light-Emitting Element>

Figure 5:
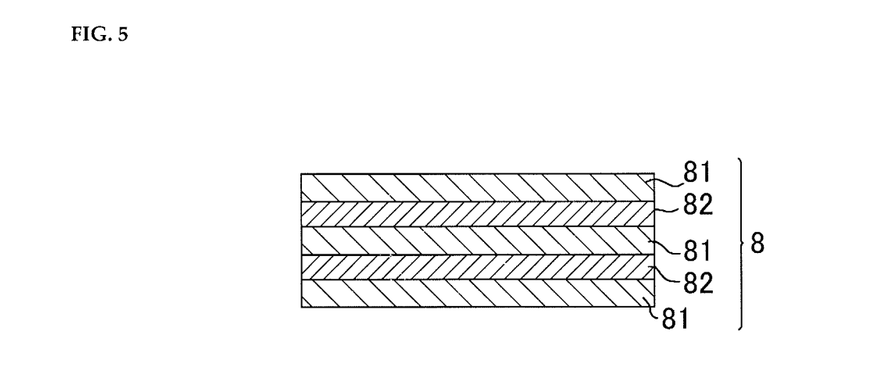
[FIG. 5] A schematic side section view of a clad material for use in a substrate for holding an LED light-emitting element according to another embodiment of the present invention.

Copper plates (purity 99.9%) of diameter 200 mm and thickness 0.02 mm and molybdenum plates (purity 99.9%) of diameter 200 mm and thickness 0.02 mm were prepared. Three copper plates (reference number 81 in FIG. 5) and two molybdenum plates (reference number 82 in FIG. 5) were alternately laminated, then sandwiched between graphite plates of diameter 200 mm coated with a BN mold release agent.

The resulting laminate was set in a hot press machine, and hot-pressed for one hour in a vacuum at a temperature of 1000° C. with an applied pressure of 14.7 MPa. After cooling to room temperature and withdrawing, the BN mold release agent was removed with sandpaper to obtain a clad material of diameter 200 mm×0.1 mm and a surface roughness (Ra) of 0.08 μm.

The resulting clad material was used to prepare a test sample for measuring the coefficient of linear thermal expansion (3 mm×10 mm), a test sample for measuring the thermal conductivity (25 mm×25 mm) and a test sample for measuring the volume resistivity (50 mm×50 mm). The respective test samples were used to measure the coefficient of linear thermal expansion from temperatures of 25° C. to 150° C. (Seico Electronics TMA 300), the thermal conductivity at a temperature of 25° C. by the laser flash method (Ulvac TC3000) and the volume resistivity using the four-terminal method (according to JIS R1637). The resulting coefficient of linear thermal expansion from temperatures of 25° C. to 150° C., thermal conductivity at a temperature of 25° C., and volume resistivity are shown in Table 1.

INDUSTRIAL APPLICABILITY

The clad material for use on a substrate for holding an LED light-emitting element of the present invention provides a holding substrate with high thermal conductivity having a small difference in coefficient of linear thermal expansion from the group III-V semiconductor crystal constituting the LED, enabling a high-power LED light-emitting element excelling in heat dissipation and reliability to be offered. Furthermore, the clad material for use on a substrate for holding an LED light-emitting element of the present invention excels in chemical resistance to acidic and alkaline solutions used when manufacturing LED light-emitting elements, and can be made electrically conductive, enabling electrodes to be formed on both surfaces of the group III-V semiconductor crystal constituting the LED. For this reason, it can reduce the production processes for LED light-emitting elements and increase the amount of light emitted per unit area, and is effective as a substrate for holding LED light-emitting elements.

DESCRIPTION OF THE REFERENCE NUMBERS 1 growth substrate
2 nitride buffer layer formed on growth substrate
3 n-type group III-V semiconductor layer
4 light emitting layer
5 p-type group III-V semiconductor layer
6 metal layer (reflective layer)
7 metal layer
8 clad material for use on substrate for holding LED light-emitting element
81 copper plate
82 molybdenum plate
9 transparent conductive layer
10 surface coating layer
11 substrate

The invention claimed is:

1. A clad material for use with a substrate for holding an LED light-emitting element, formed by lamination of a plurality of layers consisting of different materials, and bonded to a group III-V semiconductor crystal surface via a metal layer, having a coefficient of linear expansion of $14 \times 10^{-6}$/K or less, and a thermal conductivity of 200 W/mK or more at a temperature of 25 °C.,
consisting of five layers formed by alternately laminating three copper layers and two molybdenum layers, the copper and molybdenum being at least 99.9 percent purity,
wherein a proportion of a volume occupied by the molybdenum layers relative to that of the clad material is 20 to 70 vol %, a thickness difference between any two copper layers is 5% or less, a thickness difference between the two molybdenum layers is 5% or less, and a surface roughness (Ra) of the clad material is 0.01 to 0.09 μm, and
wherein a volume resistivity of the clad material is $10^{-9}$ to $10^{-5}$ 106·m.

2. The clad material for use with a substrate for holding an LED light-emitting element of claim 1, formed by alternately laminating copper layers and molybdenum layers.

3. A clad material for use with a substrate for holding an LED light-emitting element, formed by lamination of a plurality of layers consisting of different materials, and bonded to a group III-V semiconductor crystal surface via a metal layer, having a coefficient of linear expansion of $14 \times 10^{-6}$/K or less, and a thermal conductivity of 200 W/mK or more at a temperature of 25 °C.,
consisting of three layers formed by alternately laminating two copper layers and a molybdenum layer, the copper and molybdenum being at least 99.9 percent purity,
wherein a proportion of a volume occupied by the molybdenum layer relative to that of the clad material is 10 to 60 vol %, a thickness difference between the two copper layers is 5% or less, and a surface roughness (Ra) of the clad material is 0.01 to 0.09 μm, and
wherein a volume resistivity of the clad material is $10^{-9}$ to $10^{-5}$ Ω·m.

4. The clad material for use with a substrate for holding an LED light-emitting element of claim 1, having a plate thickness of 0.05 mm to 0.2mm.

5. The clad material for use with a substrate for holding an LED light-emitting element of claim 3, having a plate thickness of 0.05 mm to 0.2 mm.

6. The clad material for use with a substrate for holding an LED light-emitting element of claim 1, having an Ni plating layer or an Ni plating layer +Au plating layer of thickness 0.5 to 5 μm formed on the surface of the clad material.

7. The clad material for use with a substrate for holding an LED light-emitting element of claim 3, having an Ni plating layer or an Ni plating layer +Au plating layer of thickness 0.5 to 5 μm formed on the surface of the clad material.

8. A method of manufacturing the clad material for use with a substrate for holding an LED light-emitting element of claim 1, the method of manufacturing a clad material comprising a step of laminating a plurality of layers consisting of different materials, then bonding the laminate by hot uniaxial processing with an applied pressure of at least 4.9 MPa and at most 14.7 MPa, at a temperature of at least 850 °C. and at most 1000° C.

9. The method of manufacturing a clad material of claim 8, wherein the bonding by hot uniaxial processing is performed in a nitrogen atmosphere, an argon atmosphere, a helium atmosphere or in a vacuum.

10. An LED light-emitting element manufactured by a method comprising:
(1) epitaxially growing a group II-V semiconductor crystal on one principal face of a single-crystal growth substrate;

(2) bonding a clad material in accordance with claim 1 to the group III-V semiconductor crystal surface via a metal layer and removing the single-crystal growth substrate from the back surface; and (3) performing a surface treatment on the group III-V semiconductor crystal surface, forming electrodes, then cutting.

11. The LED light-emitting element of claim 10, wherein the single-crystal growth substrate is chosen from the group consisting of single-crystal sapphire, single-crystal silicon carbide, single-crystal GaAs and single-crystal Si.

12. The LED light-emitting element of claim 11, wherein the single-crystal growth substrate is coated with a material chosen from the group consisting of AlN, SiC, GaN and GaAs.

13. The LED light-emitting element of claim 10, wherein the group III-V semiconductor crystal is one of GaN, GaAs and GaP.

\* \* \* \* \*